United States Patent
Seshita

(10) Patent No.: US 8,295,784 B2
(45) Date of Patent: Oct. 23, 2012

(54) SEMICONDUCTOR SWITCHING DEVICE

(75) Inventor: Toshiki Seshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1135 days.

(21) Appl. No.: 12/172,454

(22) Filed: Jul. 14, 2008

(65) Prior Publication Data

US 2009/0023415 A1 Jan. 22, 2009

(30) Foreign Application Priority Data

Jul. 20, 2007 (JP) ................................. 2007-189027

(51) Int. Cl.
*H04B 1/44* (2006.01)
(52) U.S. Cl. ............... 455/83; 455/82; 455/80; 455/333
(58) Field of Classification Search .............. 455/78–83, 455/333
See application file for complete search history.

(56) References Cited

U.S. PATENT DOCUMENTS

| | | | | |
|---|---|---|---|---|
| 5,400,017 A * | 3/1995 | Yoshisaka et al. | ......... | 340/12.12 |
| 5,475,875 A * | 12/1995 | Katsuyama et al. | .......... | 455/275 |
| 5,594,394 A * | 1/1997 | Sasaki et al. | .................. | 333/103 |
| 5,689,818 A * | 11/1997 | Caglio et al. | .................... | 455/83 |
| 5,822,684 A * | 10/1998 | Kitakubo | ....................... | 455/78 |
| 5,878,331 A * | 3/1999 | Yamamoto et al. | ............. | 455/83 |
| 5,911,116 A * | 6/1999 | Nosswitz | ........................ | 455/83 |
| 6,085,071 A * | 7/2000 | Yamada et al. | ................. | 455/82 |
| 6,308,047 B1 * | 10/2001 | Yamamoto et al. | ............. | 455/73 |
| 6,791,397 B2 * | 9/2004 | Shimozono | .................. | 327/543 |
| 6,804,502 B2 * | 10/2004 | Burgener et al. | ............. | 455/333 |
| 6,937,846 B1 * | 8/2005 | Herzberg | ........................ | 455/83 |
| 7,020,453 B2 * | 3/2006 | Hidaka et al. | ................. | 455/333 |
| 7,123,898 B2 * | 10/2006 | Burgener et al. | ............. | 455/333 |
| 2002/0180510 A1 * | 12/2002 | Tamura | ......................... | 327/419 |
| 2003/0090313 A1 * | 5/2003 | Burgener et al. | ............. | 327/408 |
| 2003/0171098 A1 * | 9/2003 | Tai et al. | ......................... | 455/78 |
| 2005/0048927 A1 * | 3/2005 | Kemmochi et al. | ............. | 455/78 |
| 2005/0190691 A1 * | 9/2005 | Seshita et al. | ................. | 370/217 |

FOREIGN PATENT DOCUMENTS

JP 2005-244850 9/2005
WO WO 03/107551 A1 12/2003

* cited by examiner

*Primary Examiner* — Edward Urban
*Assistant Examiner* — Rui Hu
(74) *Attorney, Agent, or Firm* — Oblon, Spivak, McClelland, Maier & Neustadt, L.L.P.

(57) ABSTRACT

A semiconductor switching device includes, on one semiconductor substrate: a switching circuit configured to switch connection states between a plurality of terminals; a negative voltage generating circuit; and a control circuit connected to the switching circuit and the negative voltage generating circuit and configured to supply a control signal to the switching circuit, the control circuit including: a level shift circuit with a low-potential power supply terminal connected to the negative voltage generating circuit and an output node connected to the switching circuit, the level shift circuit being configured to supply a negative potential signal as a control signal at a low level to the switching circuit; a diode with its anode connected to the output node of the level shift circuit; and a transistor with its drain-source path connected between the cathode of the diode and ground, the drain-source path switching from a blocking state to a conducting state before the potential of the output node of the level shift circuit switches from a high level to the low level.

7 Claims, 14 Drawing Sheets

SEMICONDUCTOR SWITCHING DEVICE

CROSS-REFERENCE TO RELATED APPLICATIONS

This application is based upon and claims the benefit of priority from the prior Japanese Patent Application No. 2007-189027, filed on Jul. 20, 2007; the entire contents of which are incorporated herein by reference.

BACKGROUND OF THE INVENTION

1. Field of the Invention
This invention relates to a semiconductor switching device.
2. Background Art
An SPDT (single-pole double-throw) switch based on semiconductor switches for switching transmission and reception is used in high-frequency communication devices such as mobile phones (e.g., JP-A 2005-244850 (Kokai)). The SPDT switch is operable to switch an input at a single input terminal to one of two output terminals for signal lines.

For example, an SPDT switch for time-division transmission/reception switching requires that a transmit signal inputted thereto with a large voltage amplitude be free from distortion. To this end, a negative potential signal is used as the low level of a control signal for driving the switch. Inclusion of a negative voltage generating circuit for generating the low level with a negative potential hinders the reduction of switching time.

SUMMARY OF THE INVENTION

According to an aspect of the invention, there is provided a semiconductor switching device including, on one semiconductor substrate: a switching circuit configured to switch connection states between a plurality of terminals; a negative voltage generating circuit; and a control circuit connected to the switching circuit and the negative voltage generating circuit and configured to supply a control signal to the switching circuit, the control circuit including: a level shift circuit with a low-potential power supply terminal connected to the negative voltage generating circuit and an output node connected to the switching circuit, the level shift circuit being configured to supply a negative potential signal as a control signal at a low level to the switching circuit; a diode with its anode connected to the output node of the level shift circuit; and a transistor with its drain-source path connected between the cathode of the diode and ground, the drain-source path switching from a blocking state to a conducting state before the potential of the output node of the level shift circuit switches from a high level to the low level.

According to another aspect of the invention, there is provided a semiconductor switching device including, on one semiconductor substrate: a switching circuit configured to switch connection states between a plurality of terminals; a first negative voltage generating circuit configured to output a negative potential Vss1; a second negative voltage generating circuit configured to output a negative potential Vss2 on the positive side of said Vss1; a level shift circuit with a low-potential power supply terminal connected to the second negative voltage generating circuit and an output node connected to the switching circuit, the level shift circuit being configured to supply a negative potential signal as a control signal at a low level to the switching circuit; and N stages of diodes, where N is a natural number, connected in series between the output node of the first negative voltage generating circuit and the output node of the second negative voltage generating circuit with the anodes of the diodes connected on the side of the output node of the second negative voltage generating circuit, a condition $Vss2-Vss1<N\cdot Vf$ being satisfied, where Vf is the forward voltage of the diode.

According to still another aspect of the invention, there is provided a semiconductor switching device including, on one semiconductor substrate: a switching circuit configured to switch connection states between a plurality of terminals; a first negative voltage generating circuit configured to output a negative potential Vss1; a second negative voltage generating circuit configured to output a negative potential Vss2 on the positive side of said Vss1; a control circuit including: a level shift circuit with a low-potential power supply terminal connected to the second negative voltage generating circuit and an output node connected to the switching circuit, the level shift circuit being configured to supply a negative potential signal as a control signal at a low level to the switching circuit; a first diode with its anode connected to the output node of the level shift circuit; and a transistor with its drain-source path connected between the cathode of the first diode and ground, the drain-source path switching from a blocking state to a conducting state before the potential of the output node of the level shift circuit switches from a high level to the low level; and N stages of second diodes, where N is a natural number, connected in series between the output node of the first negative voltage generating circuit and the output node of the second negative voltage generating circuit with the anodes of the second diodes connected on the side of the output node of the second negative voltage generating circuit, a condition $Vss2-Vss1<N\cdot Vf$ being satisfied, where Vf is the forward voltage of the second diode.

DETAILED DESCRIPTION OF THE INVENTION

Figure 1:
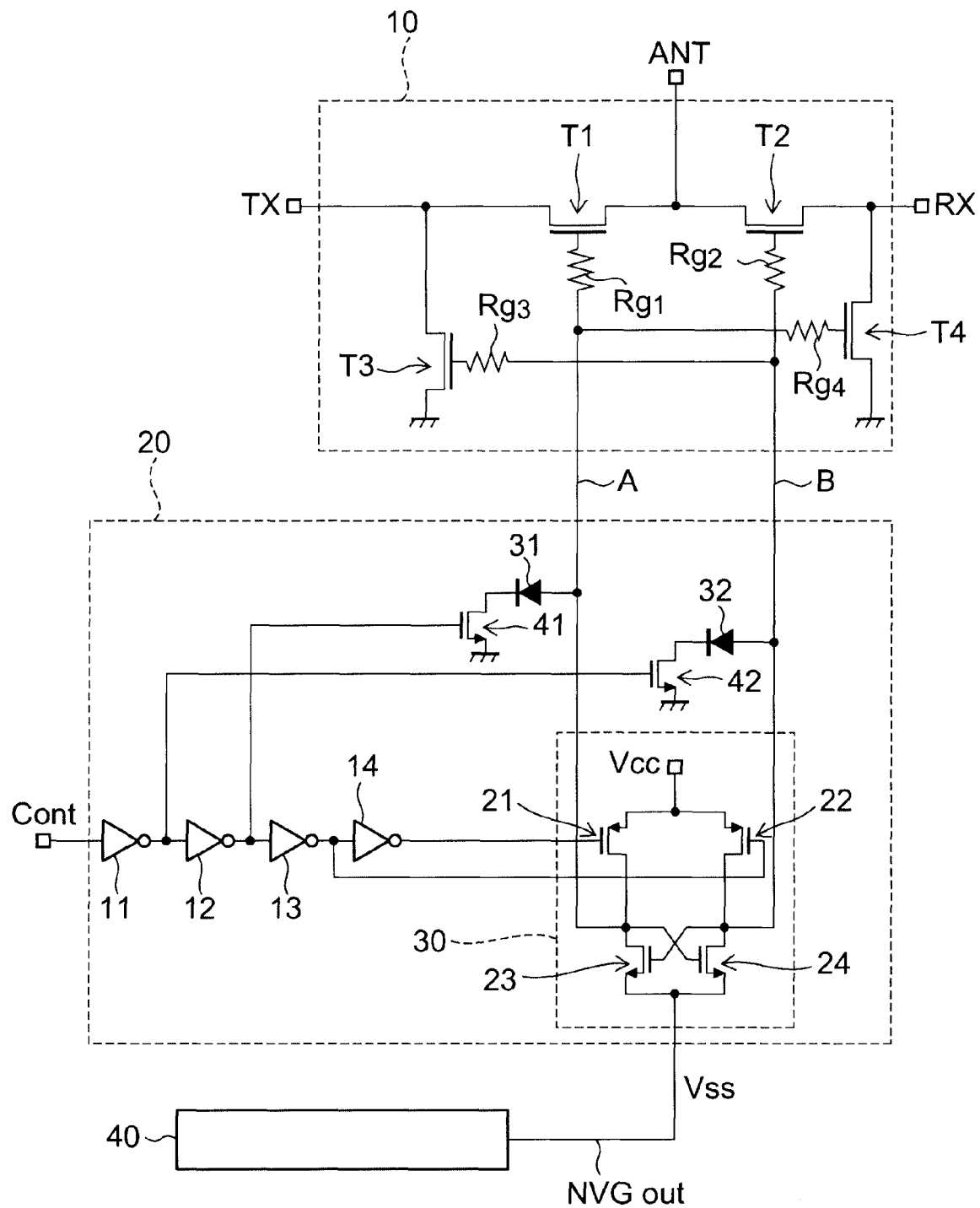
FIG. 1 is a circuit diagram of a high-frequency semiconductor switching device according to a first embodiment of the invention.

Embodiments of the invention will now be described with reference to the drawings. Common elements in the drawings are labeled with like reference numerals. In the embodiments described below, an SPDT (single-pole double-throw) switch IC is described as an example of the high-frequency semiconductor switching device.

First Embodiment

FIG. 1 is a circuit diagram of a high-frequency semiconductor switching device according to a first embodiment of the invention.

The high-frequency semiconductor switching device according to this embodiment comprises, on the same semiconductor substrate (semiconductor chip), a high-frequency switching circuit 10 for switching the connection states between a plurality of terminals, a negative voltage generating circuit 40, and a control circuit 20 connected to the high-frequency switching circuit 10 and the negative voltage generating circuit 40 and configured to supply a control signal to the high-frequency switching circuit 10.

The high-frequency switching circuit 10 includes four FETs (field effect transistors). A through transistor T1 is connected between a transmitting terminal TX and an antenna terminal ANT. A through transistor T2 is connected between a receiving terminal RX and the antenna terminal ANT. A shunt transistor T3 is connected between the transmitting terminal TX and the ground. A shunt transistor T4 is connected between the receiving terminal RX and the ground.

The gate of the through transistor T1 and the gate of the shunt transistor T4 are connected to an output node A of the control circuit 20 via resistors Rg1 and Rg4, respectively. The gate of the through transistor T2 and the gate of the shunt transistor T3 are connected to an output node B of the control circuit 20 via resistors Rg2 and Rg3, respectively. The resistors Rg1, Rg2, Rg3, Rg4 each have a resistance high enough to avoid leakage of high-frequency signals to the control circuit 20.

The negative voltage generating circuit 40 illustratively includes a charge pump circuit and a clock signal generator and supplies a negative potential Vss at the output node NVGout of the negative voltage generating circuit 40.

The control circuit 20 includes a level shift circuit 30, inverters 11-14 provided at its previous stage, a diode 31 with its anode connected to the output node A of the level shift circuit 30, a diode 32 with its anode connected to the output node B of the level shift circuit 30, a transistor 41 connected between the cathode of the diode 31 and the ground, and a transistor 42 connected between the cathode of the diode 32 and the ground.

The transistor 41 is illustratively an N-type MOSFET with its drain connected to the cathode of the diode 31, its source connected to the ground, and its gate connected to the output terminal of the inverter 12. Likewise, the transistor 42 is illustratively an N-type MOSFET with its drain connected to the cathode of the diode 32, its source connected to the ground, and its gate connected to the output terminal of the inverter 11. As described later, the drain-source path of each transistor 41, 42 switches from the blocking state to the conducting state before the potential of the output node A, B of the level shift circuit 30 switches from the high level to the low level.

The level shift circuit 30 has a high-potential power supply terminal supplied with a potential Vcc (>0 V) and a low-potential power supply terminal supplied with a negative potential Vss, which is the output potential of the negative voltage generating circuit 40.

The level shift circuit 30 includes a pair of P-type MOSFETs (hereinafter simply referred to as PMOSs) 21, 22 and a pair of N-type MOSFETs (hereinafter simply referred to as NMOSs) 23, 24. The source of each PMOS 21, 22 is connected to the high-potential power supply terminal. The source of each NMOS 23, 24 is connected to the low-potential power supply terminal.

The drain of the PMOS 21 is connected to the output node A, the drain of the NMOS 23, and the gate of the NMOS 24. The drain of the PMOS 22 is connected to the output node B, the drain of the NMOS 24, and the gate of the NMOS 23. The gate of the PMOS 21 is connected to the output terminal of the inverter 14. The gate of the PMOS 22 is connected to the output terminal of the inverter 13.

The inverter 11 receives as input a high-level or low-level signal from an external control terminal Cont, inverts it, and outputs the inverted, low-level or high-level signal. The output signal of the inverter 11 drives the transistor 42.

The inverter 12 receives as input a high-level or low-level signal from the inverter 11 at the previous stage, inverts it, and outputs the inverted, low-level or high-level signal. The output signal of the inverter 12 drives the transistor 41.

The inverter 13 receives as input a high-level or low-level signal from the inverter 12 at the previous stage, inverts it, and outputs the inverted, low-level or high-level signal to the gate of the PMOS 22 of the level shift circuit 30. The inverter 14 receives as input a high-level or low-level signal from the inverter 13 at the previous stage, inverts it, and outputs the inverted, low-level or high-level signal to the gate of the PMOS 21 of the level shift circuit 30. With regard to the logic level inputted to the level shift circuit 30, the low level is 0 V, and the high level is Vcc (>0 V). The level shift circuit 30 converts the logic level to set the low level to Vss (<0 V) and the high level to Vcc, and supplies it to the output node A, B.

Although not shown, the inverters 11-14 of the control circuit 20 and the high-potential power supply terminal of the negative voltage generating circuit 40 are supplied with the potential Vcc (>0 V), and the low-potential power supply terminal thereof is supplied with the ground potential (0 V).

The control circuit 20 supplies a signal of the high level (Vcc) or the low level Vss (<0 V) to the output nodes A, B in accordance with the high level (Vcc) or the low level (0 V) applied to the external control terminal Cont.

When the external control terminal Cont is at the high level, the inverter 13 is at the low level, and the inverter 14 is at the high level. The output node A is supplied with the potential Vss via the NMOS 23 in the ON state and set to the low level. The output node B is supplied with the potential Vcc via the PMOS 22 in the ON state and set to the high level. When the external control terminal Cont is at the low level, contrary to the above case, the inverter 13 is at the high level, the inverter 14 is at the low level, the output node A is at the high level (Vcc), and the output node B is at the low level (Vss).

When the output node A is at the high level and the output node B is at the low level, the through transistor T1 and the shunt transistor T4 are each in the conducting state (ON), and the through transistor T2 and the shunt transistor T3 are each in the blocking state (OFF). This results in a transmitting mode in which the conducting state is established between the transmitting terminal TX and the antenna terminal ANT, and the blocking state is established between the antenna terminal ANT and the receiving terminal RX.

Conversely, when the output node A is at the low level and the output node B is at the high level, the through transistor T1 and the shunt transistor T4 are each in the blocking state (OFF), and the through transistor T2 and the shunt transistor T3 are each in the conducting state (ON). This results in a receiving mode in which the blocking state is established between the transmitting terminal TX and the antenna terminal ANT, and the conducting state is established between the antenna terminal ANT and the receiving terminal RX.

The shunt transistor T3 enhances isolation between the terminals TX and ANT when they are blocked from each other. More specifically, even if the through transistor T1 is in the OFF state, the receive signal may leak to the transmitting terminal TX via the through transistor T1. At this time, the leaked receive signal can be dissipated to the ground via the shunt transistor T3 in the ON state. Likewise, the shunt transistor T4 enhances isolation between the terminals RX and ANT when they are blocked from each other. More specifically, the leaked transmit signal can be dissipated to the ground via the shunt transistor T4 in the ON state when the through transistor T2 is in the OFF state.

The levels of the control signal for driving the transistors T1-T4, that is, the high level and low level at the output nodes A, B are Vcc (>0 V) and Vss (<0 V), respectively. The reason for setting the low level to a negative potential rather than 0 V is now described.

The high-frequency semiconductor switching device according to this embodiment is a time-division transmission/reception switch for switching the transmitting mode and the receiving mode for a high-frequency signal in a time-division manner, and requires that, during the transmitting mode, a transmit signal inputted thereto with a large voltage amplitude be free from distortion.

Upon input of a transmit signal with a large voltage amplitude, a large voltage amplitude is applied between the source and the drain of the transistor that is supposed to be in the blocking state during the transmitting mode. The gate electrode of that transistor is biased by a high resistance, and a gate-source capacitance Cgs and a gate-drain capacitance Cgd exist. Hence, the gate is placed at a DC bias potential superimposed with a high-frequency signal. Assuming that Cgs=Cgd, the amplitude of the high-frequency signal superimposed on the gate is half the high-frequency voltage amplitude applied between the source and the drain.

Let Vth denote the threshold voltage of a transistor in a high-frequency switching circuit, and ΔVds denote the amplitude (half-width) of the high-frequency signal applied between the drain and the source. When ΔVds/2 exceeds Vth-Vss, the transistor cannot maintain the blocking state and ends up producing distortion.

To accommodate a larger signal amplitude, it may be considered desirable to set Vss to a large negative value. However, this is limited because ΔVds is not allowed to exceed the drain-source breakdown voltage. Hence, there is an optimal region for Vss. For example, consider a high-frequency switching circuit using an NMOS with Vth being 0.8 V and a drain-source breakdown voltage of 5 V. If ΔVds exceeds 5 V, leakage current occurs between the drain and the source. Hence, the maximum of ΔVds is 5 V. To maintain the blocking state during ΔVds=5 V, Vss must be −1.7 V or less. However, unduly decreasing Vss results in decreasing the drain-source breakdown voltage in view of MOSFET characteristics, and thus −1.7 V is the lower bound. The foregoing has been a conceptual description based on a brief consideration. In a practical device, a maximum allowable input power is favorably obtained for an appropriate range (e.g., −1.2 V to −1.7 V) of Vss.

Figure 12:
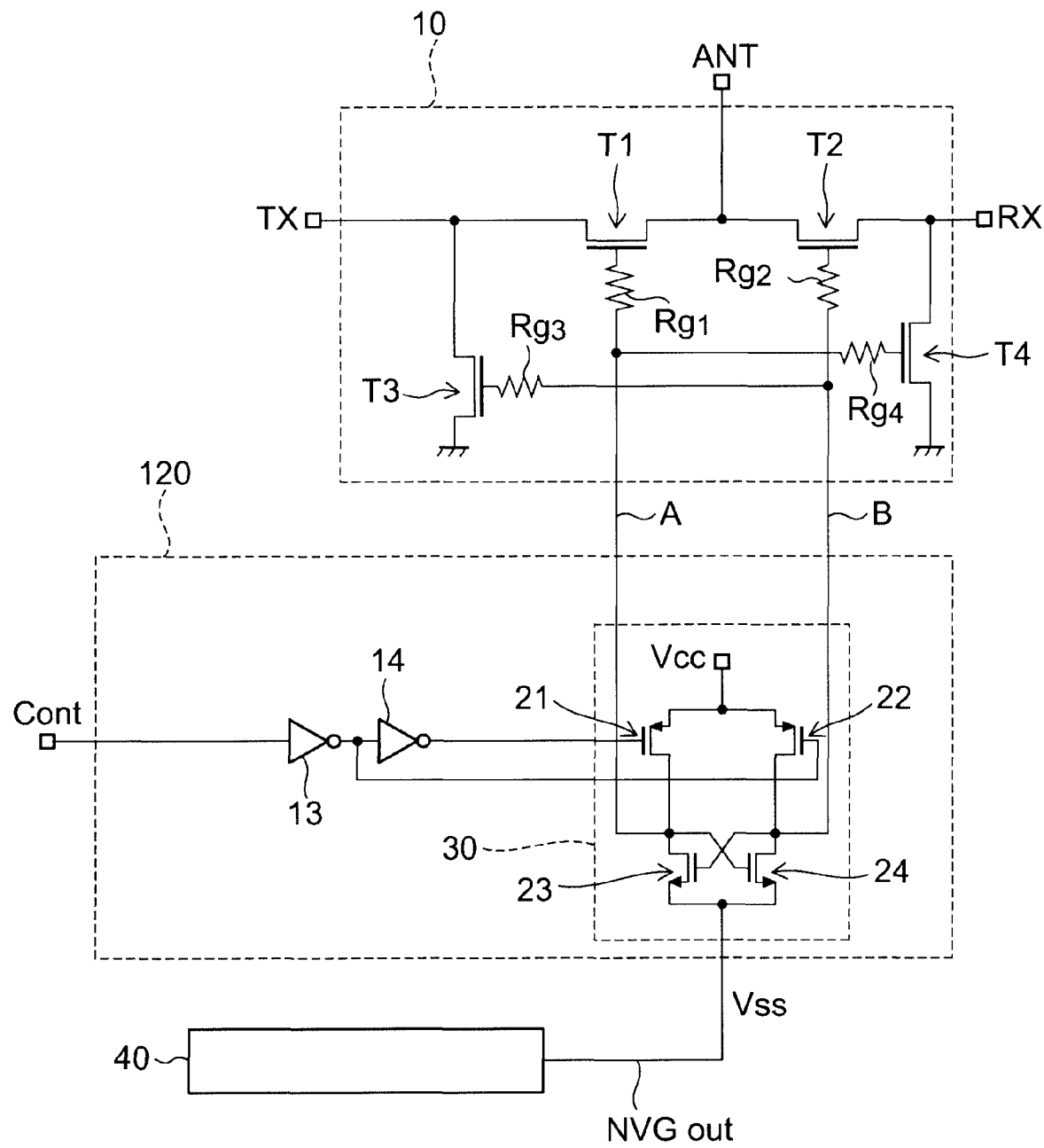
FIG. 12 is a circuit diagram of a high-frequency semiconductor switching device of a comparative example.

FIG. 12 is a circuit diagram of a high-frequency semiconductor switching device of a comparative example. In contrast to the high-frequency semiconductor switching device according to the first embodiment shown in FIG. 1, the control circuit 120 of the comparative example lacks the diodes 31, 32 and transistors 41, 42, and also lacks the inverters 11, 12 for driving the transistors 41, 42.

Figure 13:
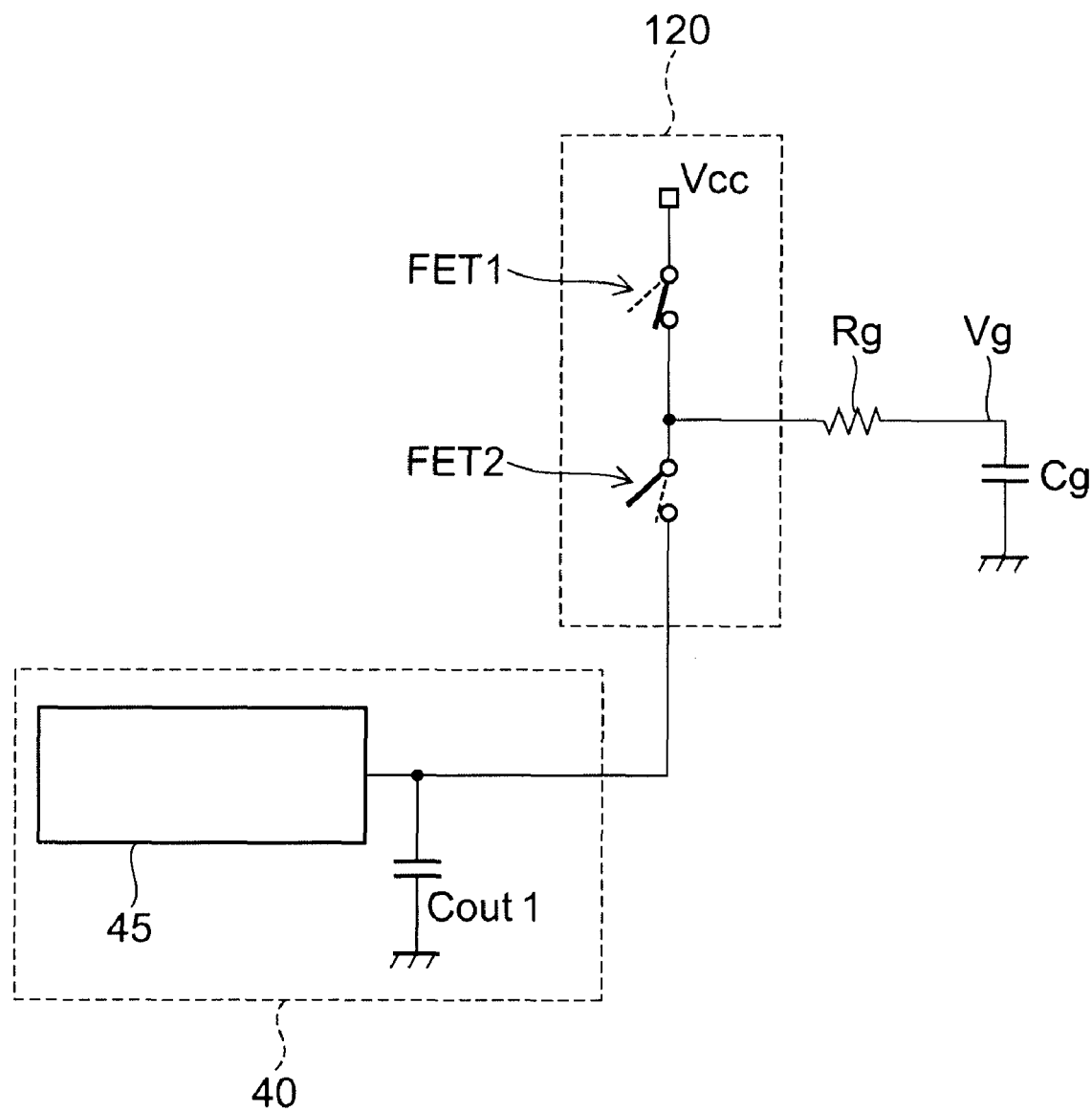
FIG. 13 is an equivalent circuit that simplifies the configuration of FIG. 12.

FIG. 13 shows an equivalent circuit that simplifies the configuration of FIG. 12 for illustrating the operation of the high-frequency semiconductor switching device of the comparative example. The high-frequency switching circuit 10 is modeled by only the gate capacitance Cg and the high resistance Rg of the transistors. The control circuit 120 is modeled by only two FETs, FET1 and FET2. The negative voltage generating circuit 40 is modeled by only the charge pump circuit 45 and the output capacitance Cout1.

As an initial state, it is assumed that FET1 is ON and FET2 is OFF. That is, the transistor gate capacitance Cg of the high-frequency switching circuit is charged with Vcc serving as the high level. Here, the transistors of the high-frequency switching circuit have a large total gate width, and hence a large gate capacitance Cg (e.g., approximately 100 pF).

Next, consider a state in which FET1 is turned off and FET2 is turned on.

The charge accumulated in Cg flows into the output capacitance Cout1 of the negative voltage generating circuit 40 via FET2. This instantaneously increases the potential of the output node NVGout of the negative voltage generating circuit 40. Because the current extraction capacity of the charge pump circuit 45 intended for generating negative voltage is finite, the charge charged in the output capacitance Cout1 cannot be extracted in an extremely short time (e.g., 1 microsecond), and the potential of the node NVGout gradually approaches the initial state, Vss, with a certain time constant. Thus, the potential Vg of the gate capacitance Cg also gradually approaches Vss with a certain time constant.

In FIG. 13, a circuit simulation was performed by using the following circuit parameters.

Cg=100 pF, Rg=2.5 kΩ, Cout1=500 pF, and Vcc=3 V. The initial potential of the output node NVGout of the negative voltage generating circuit 40 was set to −1.7 V (=Vss), the output resistance of the charge pump circuit 45 was set to 17 kΩ, and the current extraction capacity of the charge pump circuit 45 was set to 100 μA.

Figure 14:
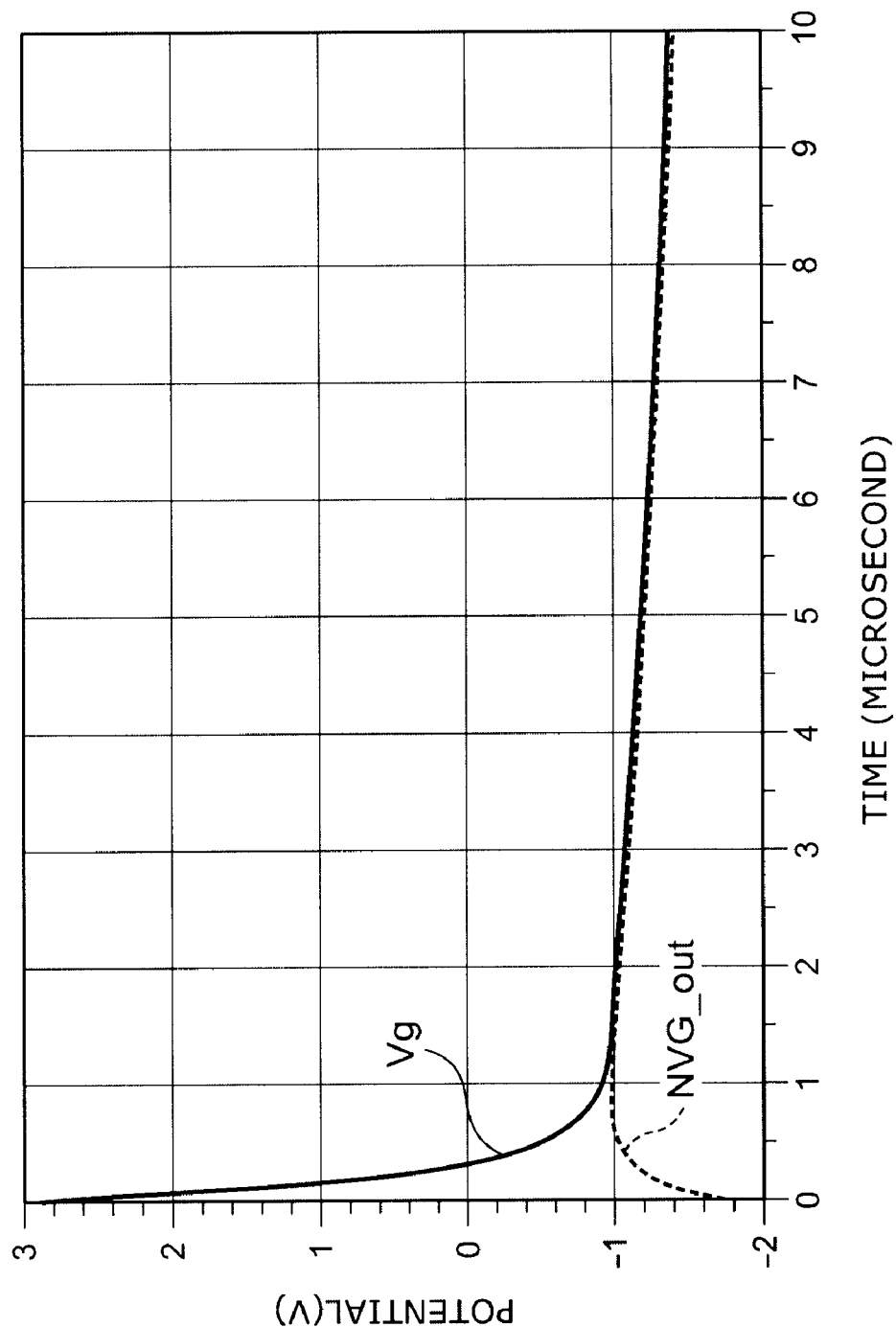
FIG. 14 is a graph showing the result of the simulation using the circuit of FIG. 13.

FIG. 14 shows the result of this simulation. In FIG. 14, the horizontal axis represents time (in microseconds), and the vertical axis represents the potential (in V) of Vg and NVGout.

From the result of FIG. 14, Vg steeply falls to approximately −0.9 V. This is accounted for by the following formula:

Voltage to which $Vg$ steeply falls$=Vss+(Vcc-Vss)\times Cg/(Cg+Cout1)$

From this formula, Vg instantaneously reaches Vss if Cout1 has an extremely larger value than Cg.

Now, assume that the high-frequency switching circuit produces distortion before Vg reaches −1.2 V. In this case, it turns out from FIG. 14 that switching requires a time period of 5 microseconds. On the other hand, the time-division transmission/reception switch is assumed here, which requires a switching time of 1 microsecond or less. Hence, the requirement of practical use is not satisfied by the characteristics as shown in FIG. 14.

One method for increasing the switching rate is to extremely increase Cout1 as compared with Cg. However, in practice, incorporating Cout1 with large capacitance into a semiconductor integrated circuit causes the problem of increased chip area.

On the other hand, after Vg falls to approximately −0.9 V, the time constant is determined by the current extraction capacity of the charge pump circuit 45. Hence, the time constant of approaching Vss can be decreased if the current extraction capacity of the charge pump circuit 45 is increased. However, also in this case, incorporating a charge pump circuit 45 with large current extraction capacity into a semiconductor integrated circuit causes the problem of increased power consumption and chip area.

Thus, in the configuration of the comparative example, attempts to reduce the transmission/reception switching time cause the problem of increased chip area and power consumption.

In this embodiment, as described above with reference to FIG. 1, a diode 31 and a transistor 41 are connected between the output node A of the control circuit 20 and the ground, and a diode 32 and a transistor 42 are connected between the output node B and the ground. Furthermore, inverters 12, 11 for driving the transistors 41, 42, respectively, are provided at the previous stage of inverters 13, 14 for driving the level shift circuit 30.

In this embodiment, assume that the external control terminal Cont is now supplied with the high level. At this time, the node A is at the low level, and the node B is at the high level. As described above, the low level here is the output potential Vss (<0V) of the negative voltage generating circuit 40, and the high level is Vcc, which is supplied to the level shift circuit 30 as a high-potential power supply.

The gate of the transistor 41 is supplied with the high level and turned on. However, because the diode 31 is reverse biased, the transistor 41 is not operating. On the other hand, the gate of the transistor 42 is supplied with the low level, and hence the transistor 42 is also not operating.

Here, consider the case where the external control terminal Cont is switched from the high level to the low level. The node A is turned into the high level. At this time, the transistor 41 is turned off, and its existence can be left out of consideration. On the other hand, the node B is turned into the low level. At this time, the transistor 42 is turned on. While the diode 32 is forward biased, the current flows from the node B via the diode 32 and the transistor 42 into the ground.

Here, the transistor 42 is activated before the level shift circuit 30 is activated. More specifically, the charge accumulated in the node B is discharged to the ground by the turning on of the transistor 42 before the change of output potential of the level shift circuit 30. The discharge continues until the potential of the node B reaches the forward voltage Vf of the diode 32. After the potential of the node B reaches Vf, the output potential of the level shift circuit 30 changes, and the node B reaches the desired low level, Vss. This can be realized by sufficiently increasing the delay time of the inverter 13 so that the output of the level shift circuit 30 switches after the potential of the output node B reaches Vf.

Figure 2:
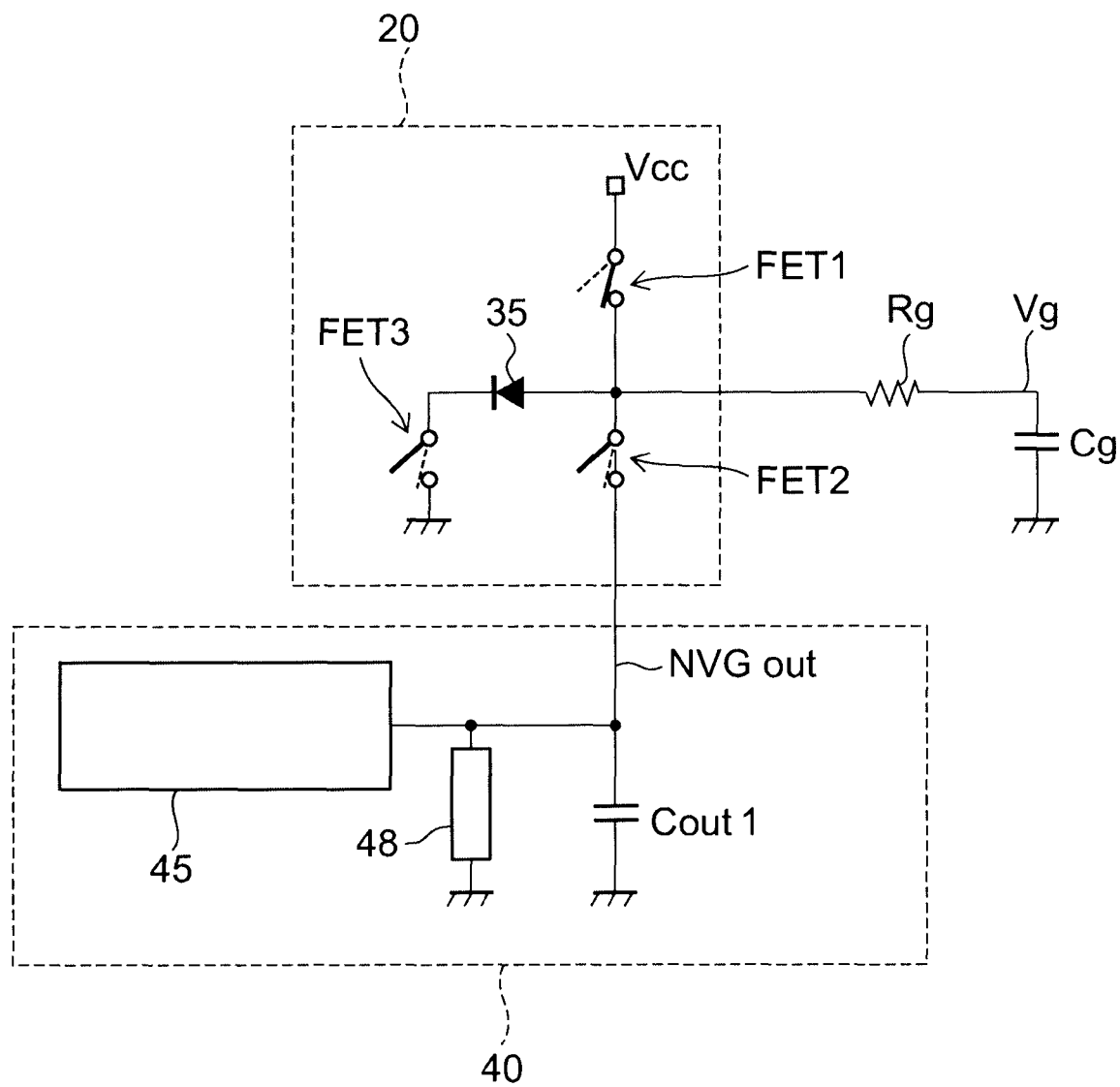
FIG. 2 is an equivalent circuit that simplifies the configuration of FIG. 1.

FIG. 2 shows an equivalent circuit that simplifies the configuration of FIG. 1 for illustrating the operation of the high-frequency semiconductor switching device according to the first embodiment. In contrast to the circuit of FIG. 13 described above, the circuit of FIG. 2 includes a diode 35 corresponding to the diodes 31, 32 and FET3 corresponding to the transistors 41, 42, which additionally constitute the control circuit 20. The circuit is configured so that FET3 switches from OFF to ON before FET2 switches from OFF to ON.

In the circuit of FIG. 2, a circuit simulation was performed by using the following circuit parameters.

Cg=100 pF, Rg=25 kΩ, and Cout1=500 pF. The forward voltage of the diode 35, Vf=0.6 V. The initial potential of NVGout was set to −1.7 V (=Vss), the output resistance of the charge pump circuit 45 was set to 17 kΩ, and the current extraction capacity of the charge pump circuit 45 was set to 100 µA.

Figure 3:
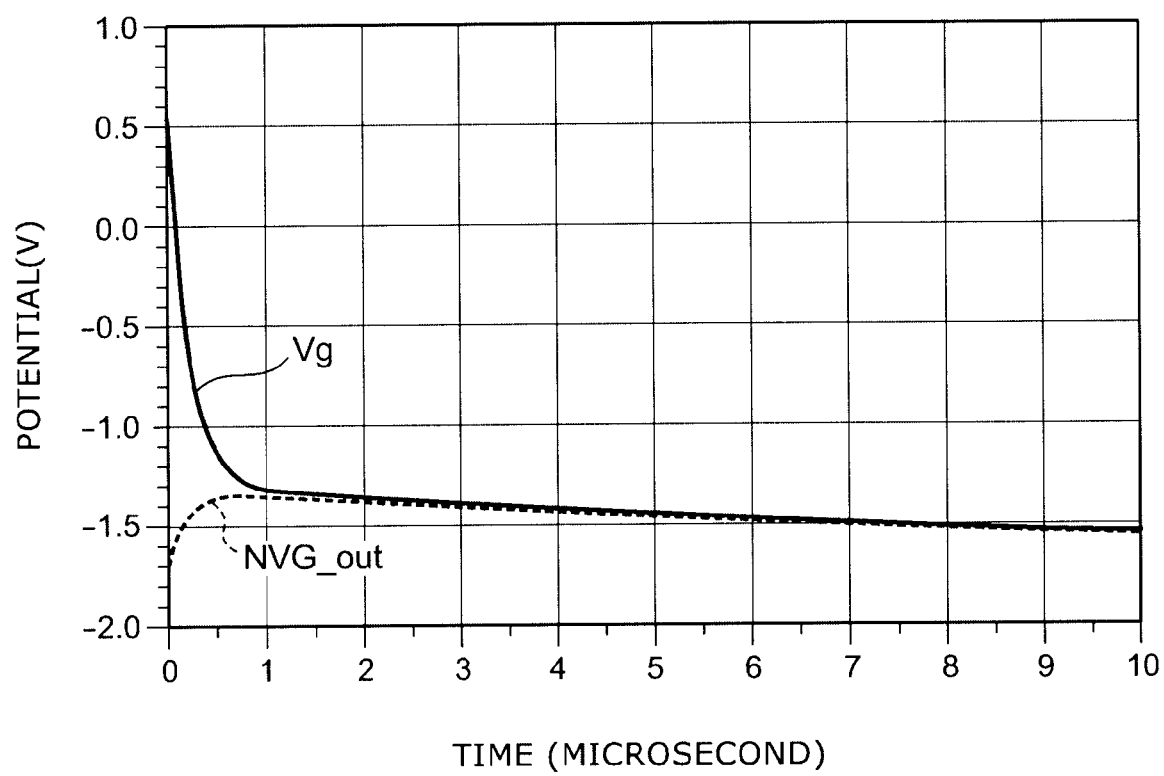
FIG. 3 is a graph showing the result of the simulation using the circuit of FIG. 2.

FIG. 3 shows the result of this simulation. In FIG. 3, the horizontal axis represents time (in microseconds), and the vertical axis represents the potential (in V) of Vg and NVGout.

From the result of FIG. 3, Vg steeply (within 1 microsecond) falls to approximately −1.3 V. This is accounted for by the following formula:

$$\text{Voltage to which } Vg \text{ steeply falls} = Vss + (Vf - Vss) \times Cg/(Cg + Cout1)$$

Thus, according to this embodiment, the falling waveform of the control signal of the high-frequency switching circuit 10 at the turn-off time can be made steep by simply adding a few devices (diodes 31, 32, transistors 41, 42) without increasing the output capacitance and current extraction capacity of the negative voltage generating circuit 40. Hence, the transmission/reception switching time of the time-division transmission/reception switch can be significantly reduced.

The diode 31, 32 is preferably a Schottky barrier diode, which has a relatively small forward voltage Vf, allowing the falling waveform of the control signal to be made steeper.

The negative voltage generating circuit 40 is preferably of the charge pump type. The charge pump circuit has a smaller ripple than inverting step-up circuits, for example. Thus, noise and distortion occurring in the high-frequency switching circuit 10 can be reduced.

In the case of using a charge pump circuit without a load, the potential of its output node NVGout continues to decrease. Hence, a clamp circuit 48 for clamping the potential of the node NVGout to the desired value Vss is preferably provided between the node NVGout and the ground as shown in FIG. 2 so that the output potential of the negative voltage generating circuit 40 is kept constant when the control voltage of the external control terminal Cont is constant.

The clamp circuit 48 is illustratively made of two FETs connected in series between the node NVGout and the ground. In the case where Vss is −1.5 V, for example, if each FET has a threshold of 0.75 V, the two FETs are turned off until the potential difference between the node NVGout and the ground reaches 1.5 V. At a higher potential difference, the two FETs are turned on, and the potential of the node NVGout does not decrease any further.

Second Embodiment

Figure 4:
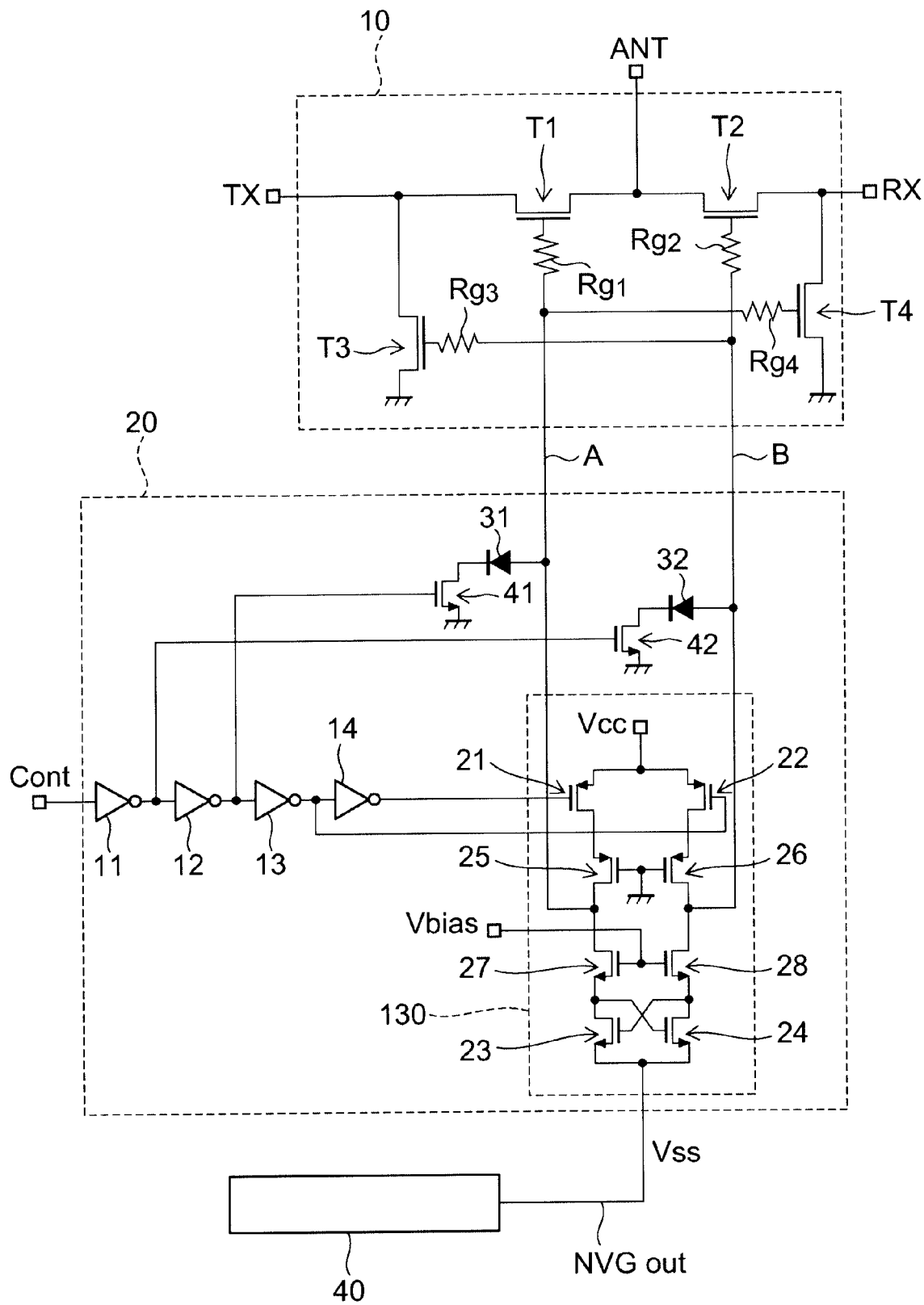
FIG. 4 is a circuit diagram of a high-frequency semiconductor switching device according to a second embodiment of the invention.

FIG. 4 is a circuit diagram of a high-frequency semiconductor switching device according to a second embodiment of the invention.

In this embodiment, the configuration of the level shift circuit 130 is different from that of the above first embodiment. More specifically, between the drain of the pair of PMOSs 21, 22 and the pair of complementary output terminals (output nodes A, B), a pair of PMOSs 25, 26 are additionally placed with each gate connected to the ground. Furthermore, between the drain of the pair of NMOSs 23, 24 and the pair of complementary output terminals (output nodes A, B), a pair of NMOSs 27, 28 are additionally placed with each gate supplied with a certain potential Vbias. By cascode connection between the pair of PMOSs 25, 26 and the pair of NMOSs 27, 28, the voltage applied between the electrodes of each MOS is limited to prevent the voltage between any pair of electrodes of each MOS from exceeding the breakdown voltage.

In the level shift circuit 30 of FIG. 1, the maximum voltage applied between the electrodes of each MOS is Vcc–Vss. In contrast, in the level shift circuit 130 of FIG. 4, the maximum voltage applied between the electrodes of each MOS can be set to approximately Vcc by setting Vbias to an appropriate value (e.g., approximately 1.5 V). Thus, stable operation can be achieved even if Vcc has no margin for MOS breakdown voltage.

Third Embodiment

Figure 5:
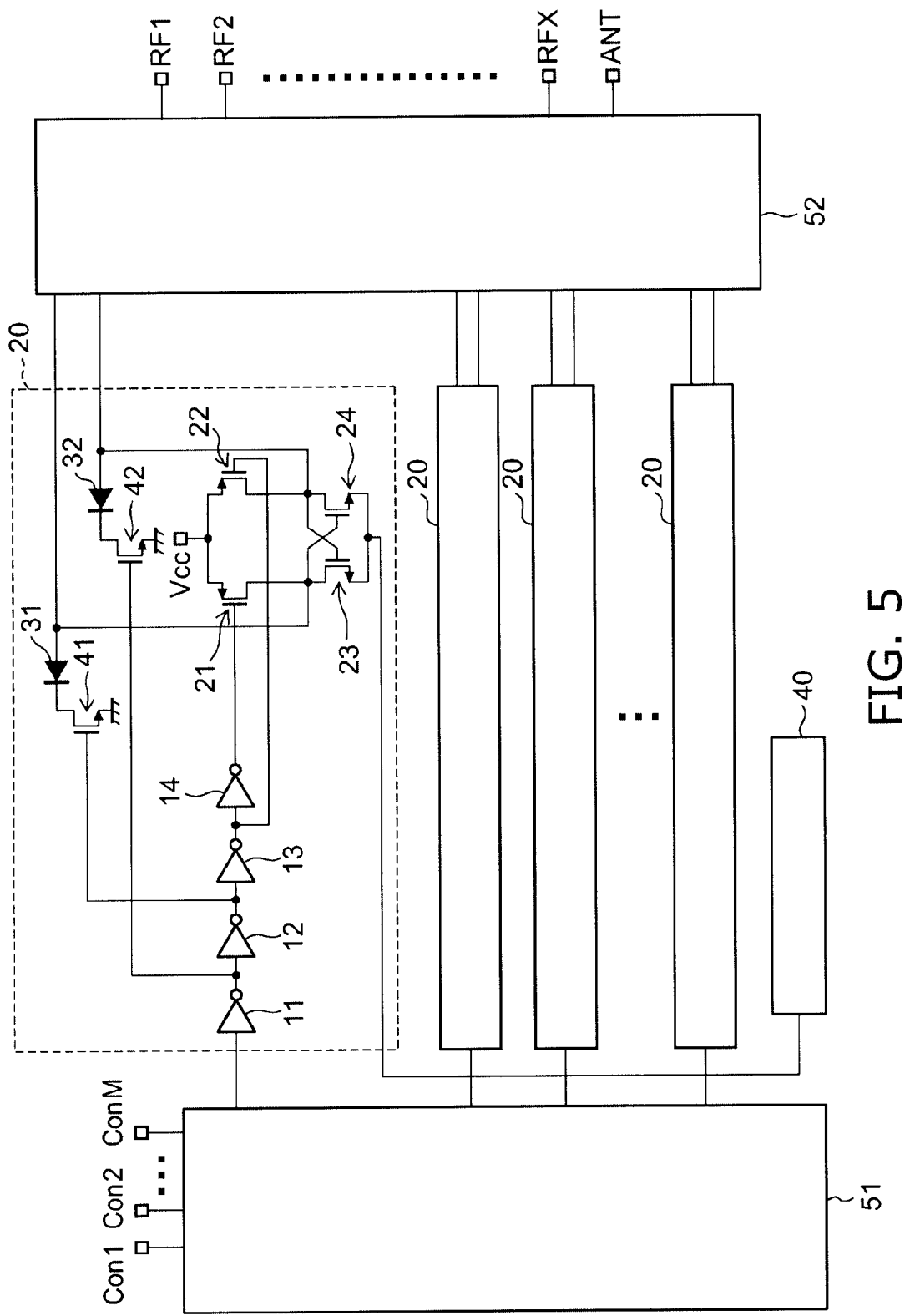
FIG. 5 is a circuit diagram of a high-frequency semiconductor switching device according to a third embodiment of the invention.

FIG. 5 is a block diagram showing the configuration of a high-frequency semiconductor switching device according to a third embodiment of the invention.

The high-frequency multiport switching circuit 52 corresponds to the high-frequency switching circuit 10 in FIG. 1. The high-frequency multiport switching circuit 52 includes one antenna terminal ANT and X high-frequency terminals RF1-RFX. Each high-frequency terminal RF1-RFX corresponds to the transmitting terminal TX or the receiving terminal RX.

A plurality of control circuits 20 are connected to the high-frequency multiport switching circuit 52. Each control circuit 20 corresponds to the control circuit 20 shown in FIG. 1 or 4. A negative voltage generating circuit 40 is connected to the low-potential power supply terminal of the level shift circuit in each control circuit 20.

Each control circuit 20 is connected to a decoder circuit 51. The decoder circuit 51 is an M/N decoder circuit, which decodes control signals at M external control terminals Con1-ConM and supplies the decoded signals to the control circuits 20. The complementary outputs (the outputs of the output nodes A, B) of each control circuit 20 are supplied to the high-frequency multiport switching circuit 52 as its control signals. The low-potential power supply of the decoder circuit 51 is the ground, imposing no burden on the negative voltage generating circuit 40.

Before proceeding to the description of a fourth embodiment of the invention, a description is given of a circuit simulation performed by using the following circuit parameters in the comparative example described above with reference to FIGS. 12 and 13.

In FIG. 13, Cg=100 pF, Rg=4 kΩ, Cout1=665 pF, and Vcc=3 V. The initial potential of the output node NVGout of the negative voltage generating circuit 40 was set to −1.7 V (=Vss), the output resistance of the charge pump circuit 45 was set to 17 kΩ, and the current extraction capacity of the charge pump circuit 45 was set to 100 μA.

Figure 8:
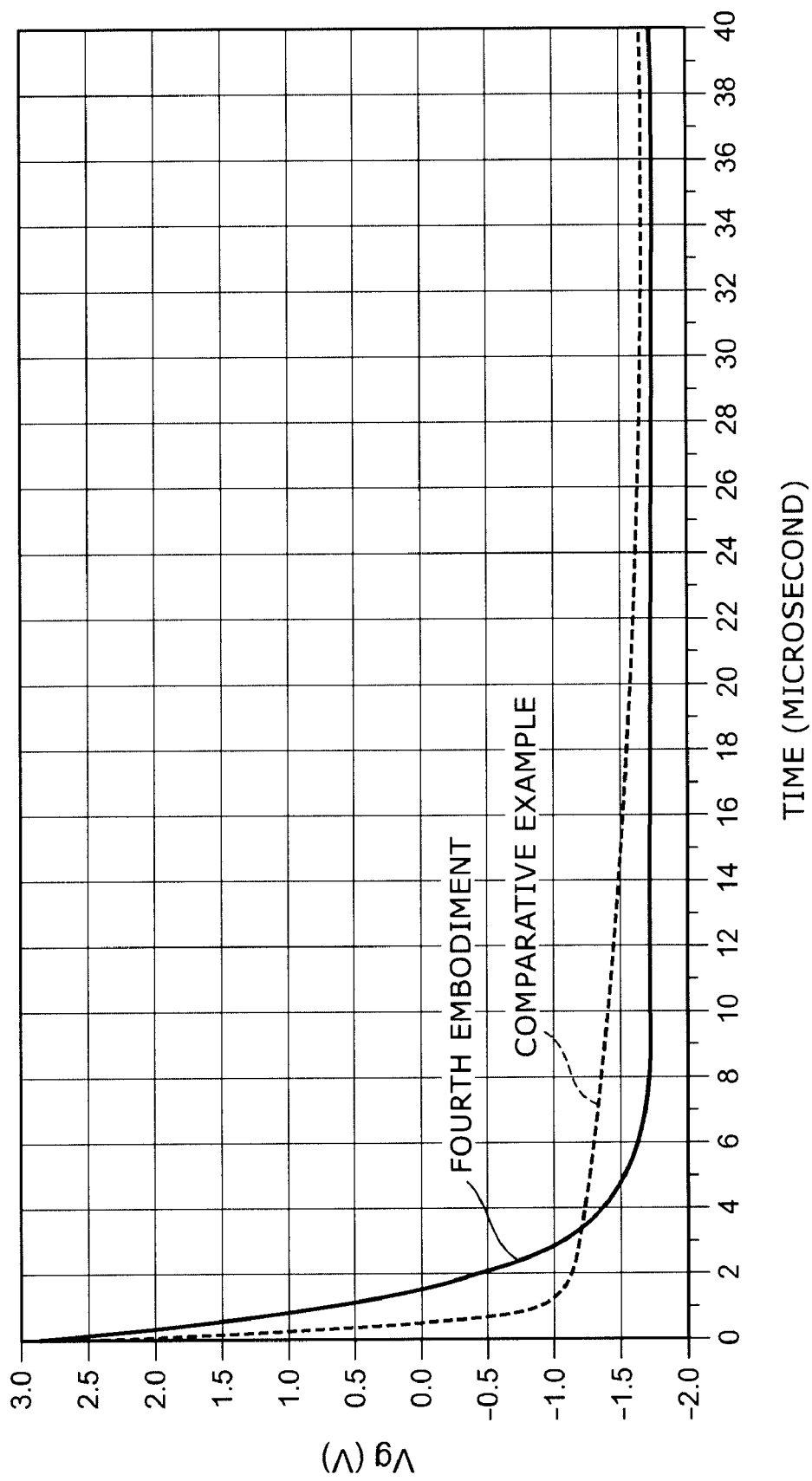
FIG. 8 is a graph showing the result of the simulation using the circuits of FIG. 7 and FIG. 13.

The relationship between Vg (V) and time (microsecond) in this case is shown by the graph of "COMPARATIVE EXAMPLE" in FIG. 8.

From this result, Vg steeply falls to approximately −1.1 V. This is accounted for by the following formula, obtained by approximating Rg to zero:

Voltage to which $Vg$ steeply falls=$Vss+(Vcc-Vss)\times Cg/(Cg+Cout1)$

Here, by increasing Cout1 as compared with Cg, the voltage to which Vg instantaneously falls approaches Vss. In this simulation, the value of Cout1 is set to as large as 665 pF so that Vg reaches −1.2 V within a time period of a few microseconds. Cout1 is formed on the semiconductor substrate by MIM (metal-insulator-metal) capacitance, and its layout area accounts for as large as several ten percent of the total chip area. That is, to reduce the switching time in the configuration of the comparative example, the negative voltage generating circuit 40 needs to have a large output capacitance, which results in an extremely large chip area.

Fourth Embodiment

Figure 6:
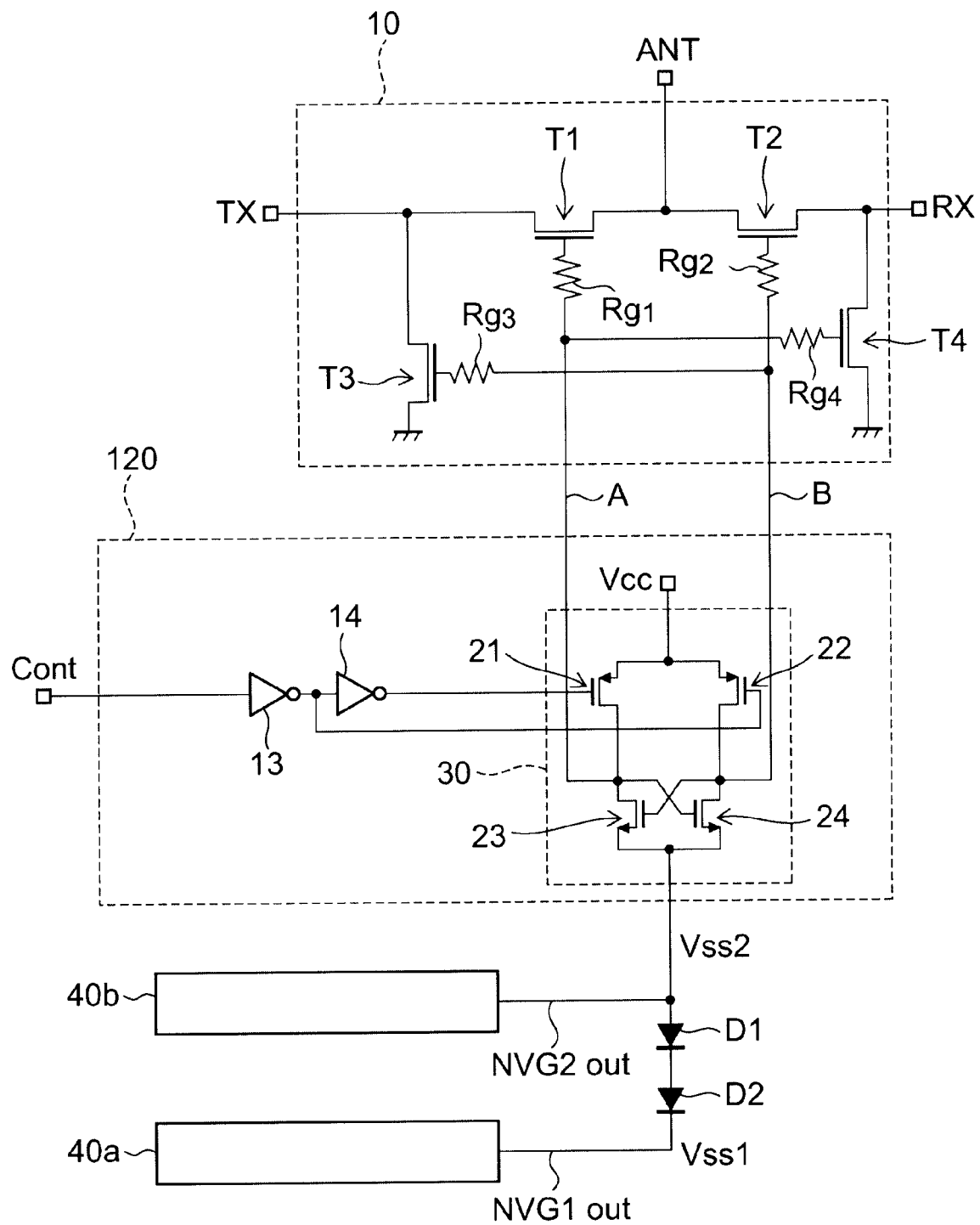
FIG. 6 is a circuit diagram of a high-frequency semiconductor switching device according to a fourth embodiment of the invention.

FIG. 6 is a circuit diagram of a high-frequency semiconductor switching device according to a fourth embodiment of the invention.

The high-frequency semiconductor switching device according to this embodiment comprises, on the same semiconductor substrate (semiconductor chip), a high-frequency switching circuit 10, a control circuit 120, a first negative voltage generating circuit 40a for outputting a negative potential Vss1 when the control voltage of the external control terminal Cont is constant, a second negative voltage generating circuit 40b for outputting a negative potential Vss2 having a value on the positive side of Vss1 when the control voltage of the external control terminal Cont is constant, and N stages of diodes D1, D2 (where N is a natural number) connected in series between the output node NVG1out of the first negative voltage generating circuit 40a and the output node NVG2out of the second negative voltage generating circuit 40b with the anodes of the diodes connected on the side of the output node NVG2out of the second negative voltage generating circuit 40b. The output node NVG2out of the second negative voltage generating circuit 40b is connected to the low-potential power supply terminal of the level shift circuit 30.

The high-frequency semiconductor switching device according to this embodiment is different from the high-frequency semiconductor switching device according to the first embodiment shown in FIG. 1 in that the former includes two negative voltage generating circuits 40a, 40b having different output potentials Vss1, Vss2 and diodes D1, D2 connected between the output nodes thereof, and that the former is configured to satisfy Vss2−Vss1<N·Vf, where Vf is the forward voltage of the diode D1, D2. FIG. 6 shows an example for N=2.

Figure 7:
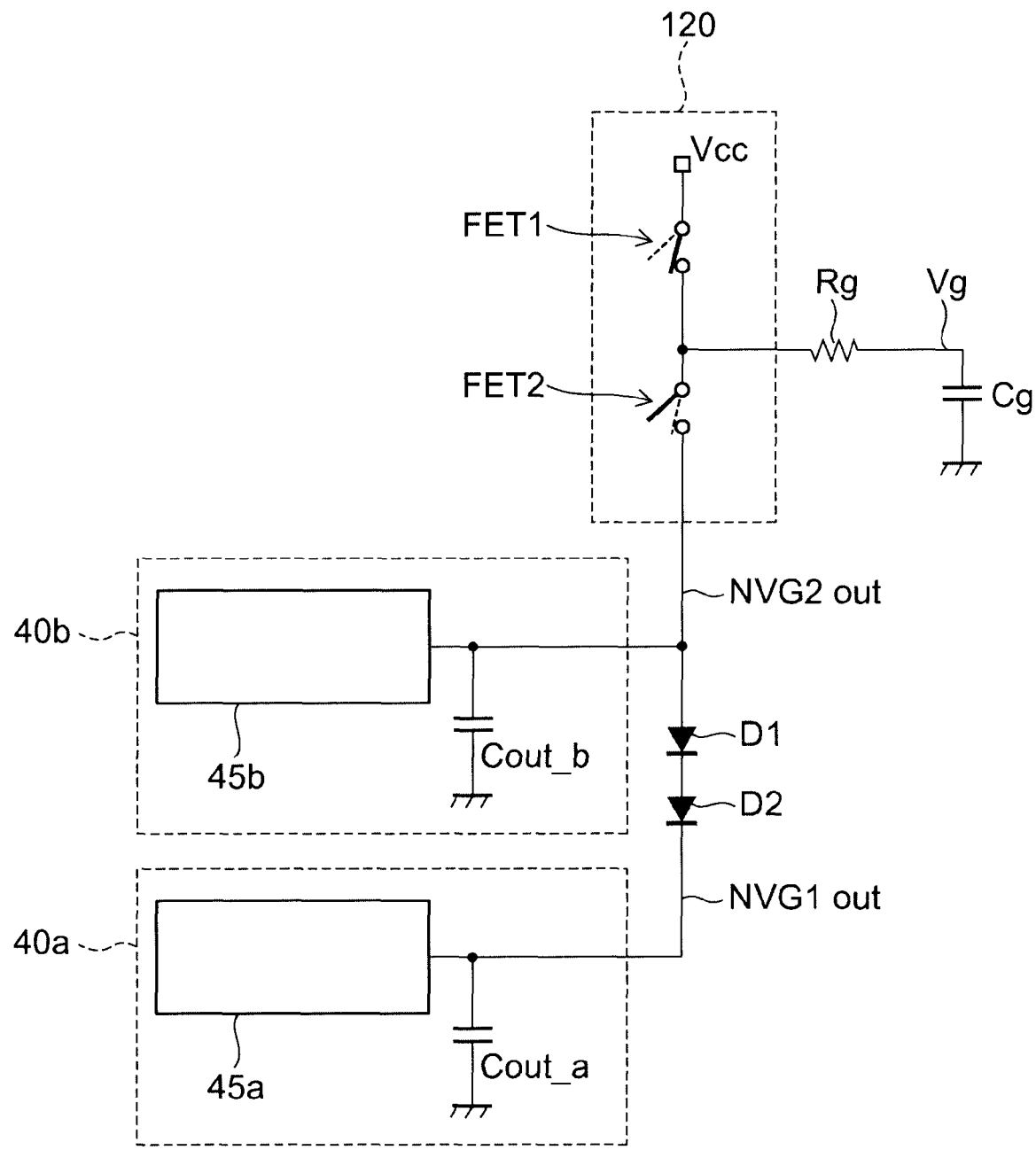
FIG. 7 is an equivalent circuit that simplifies the configuration of FIG. 6.

FIG. 7 shows an equivalent circuit that simplifies the configuration of FIG. 6 for illustrating the operation of the high-frequency semiconductor switching device according to this embodiment. The components in common with those of the circuit of FIG. 2 in the above first embodiment are labeled with like reference numerals.

The first negative voltage generating circuit 40a is specifically composed of a charge pump circuit 45a and an output capacitance Cout_a. Likewise, the second negative voltage generating circuit 40b is specifically composed of a charge pump circuit 45b and an output capacitance Cout_b. The charge pump circuit 45a, 45b can be modeled by a current source having current extraction capacity and an output resistance.

In the equivalent circuit of FIG. 7, a circuit simulation was performed by using the following circuit parameters. The relationship between Vg (V) and time (microsecond) in this case is shown by the graph of "FOURTH EMBODIMENT" in FIG. 8.

Cg=100 pF, Rg=4 kΩ, Cout_a=0, and Cout_b=0. The forward voltage of each of the diodes D1 and D2, Vf=0.71 V (where Vf is the forward voltage at which the forward current is 100 μA). The initial potential of the output node NVG1out of the first negative voltage generating circuit 40a was set to −3 V (=Vss1), the initial potential of the output node NVG2out of the second negative voltage generating circuit 40b was set to −1.7 V (=Vss2), the output resistance of the charge pump circuit 45a was set to 30 kΩ, the output resistance of the charge pump circuit 45b was set to 17 kΩ, and the current extraction capacity of each charge pump circuit 45a, 45b was set to 100 μA.

Here, Cout_a and Cout_b are both set to zero. In this simulation, although Cout_a and Cout_b are zero, as shown in FIG. 8, the time taken for Cg to reach −1.2 V is as short as 3.4 microseconds, like in the comparative example. That is, according to this embodiment, the switching time of the switch can be made as short as in the above comparative example even if the output capacitance of the negative voltage generating circuits 40a, 40b is zero.

The reason for this is described below. For the purpose of description, it is assumed that Cout_a and Cout_b have a small but finite value.

In FIG. 7, at the moment FET1 changes its state from ON to OFF and FET2 changes its state from OFF to ON, the charge charged in Cg is charged in Cout_b via FET2. At this moment, the potential of NVG2out rapidly increases, and the potential difference between NVG2out and NVG1out exceeds 2Vf. Thus, the diodes D1, D2 are turned into the conducting state, and the charge in Cg and Cout_b is charged in Cout_a. Hence, the potential of NVG1out also rapidly increases, but approaches Vss1 (=−3 V) with a certain time constant depending on the current extraction capacity of the charge pump circuit 45a. While it is intended to rapidly decrease Vg down to −1.2 V in this example, Vg falls toward −3 V at this point of time, and hence has a high falling speed. Thus, Vg can fall to −1.2 V in a time period comparable to that in the comparative example. After Vg falls below −1.2 V, the potential difference between NVG1out and NVG2out becomes 2Vf or less, and the diodes D1, D2 are turned into the blocking state. Hence, ultimately, Vg approaches Vss2 (−1.7 V), which is the stationary potential of NVG2out, and is maintained at the desired low level with a negative potential.

In general, the output of the charge pump circuit includes a ripple, which, if left unchanged, adversely affects the high-frequency switch. Hence, in practice, Cout_a and Cout_b should have a finite value to serve as a low-pass filter for removing ripples. However, the value can be approximately several ten pF at most, and does not need to have a capacitance as large as several hundred pF as in the comparative example.

As described above, according to this embodiment, the switching time can be reduced even if the output capacitance of the negative voltage generating circuits 40a, 40b is extremely small. That is, this embodiment can reduce the output capacitance of the negative voltage generating circuit, which conventionally accounts for a large ratio in chip area. Hence, the chip area can be significantly decreased.

A clamp circuit 48 as described above with reference to FIG. 2 is preferably provided between the output node NVG2out and the ground so that the output potential of the second negative voltage generating circuit 40b is kept constant when the potential of the external control terminal Cont is constant.

If the second negative voltage generating circuit 40b is configured as a charge pump circuit and the first negative voltage generating circuit 40a is configured as an inverting step-up circuit, then the number of devices can be decreased without compromising the characteristics of this embodiment as described above. The reason for this is described below.

To increase the absolute value of the output potential using a charge pump circuit, it needs to have a large number of stages. The output potential of the second negative voltage generating circuit 40b is −1.7 V in the above example, which can be realized with a small number of stages, and the increase of the number of devices can be prevented. Furthermore, use of a charge pump circuit provides the advantage of small ripple in the output potential.

On the other hand, the output potential of the first negative voltage generating circuit 40a is −3 V in the above example. Thus, assuming that the power supply voltage is 3 V, an inverting step-up circuit can be used. To realize an output potential of −3 V using a charge pump circuit, it needs to have a large number of stages. However, this output potential can be realized with a small number of stages by using an inverting step-up circuit. It is noted that the inverting step-up circuit has a larger ripple than the charge pump circuit. However, the operation of the first negative voltage generating circuit 40a is limited to the switching transition period. Hence, the disadvantage of large ripple does not adversely affect the high-frequency switch.

Fifth Embodiment

Figure 9:
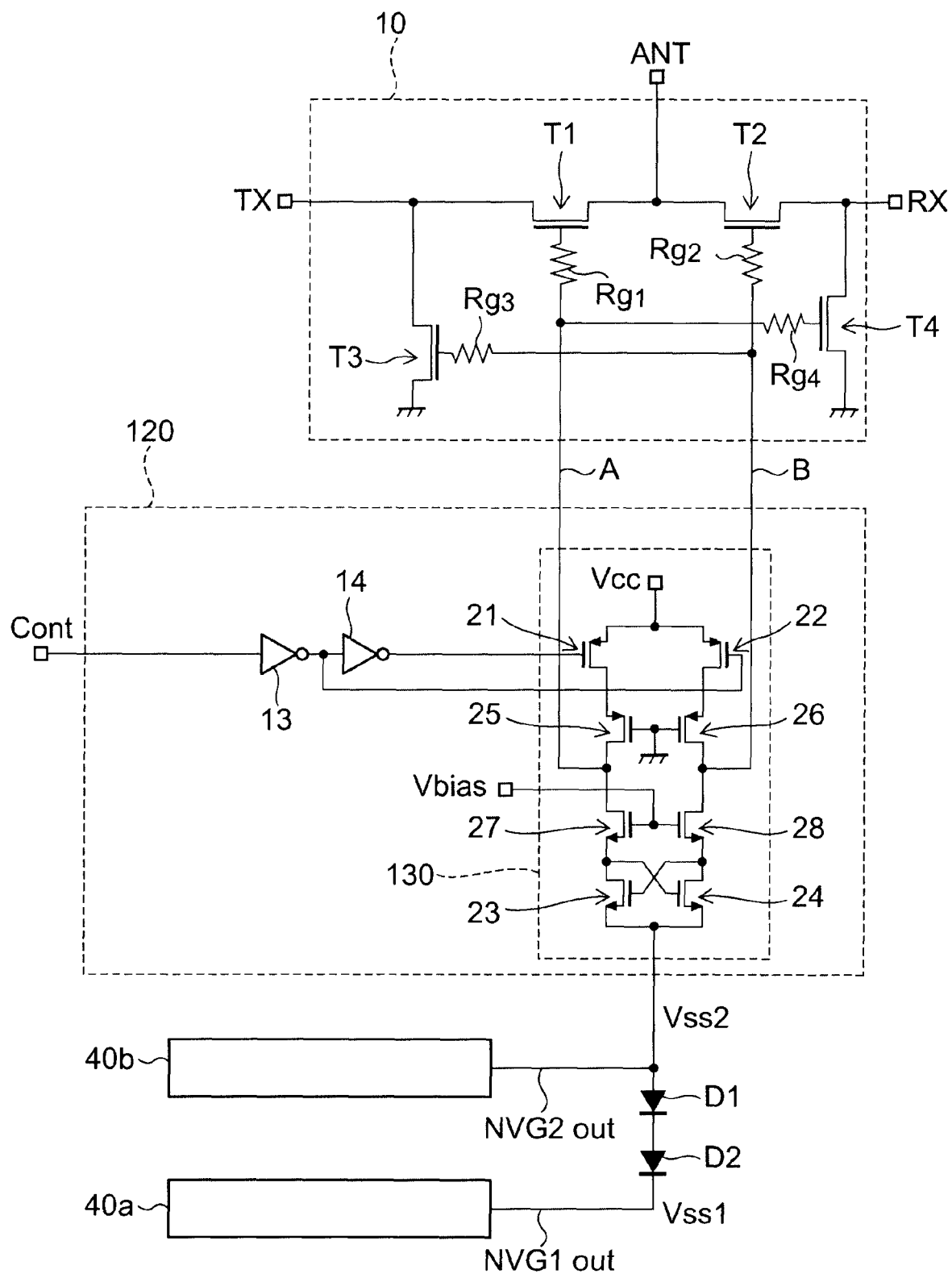
FIG. 9 is a circuit diagram of a high-frequency semiconductor switching device according to a fifth embodiment of the invention.

FIG. 9 is a circuit diagram of a high-frequency semiconductor switching device according to a fifth embodiment of the invention.

In this embodiment, the configuration of the level shift circuit 130 is different from that of the above fourth embodiment. More specifically, between the drain of the pair of PMOSs 21, 22 and the pair of complementary output terminals (output nodes A, B), a pair of PMOSs 25, 26 are additionally placed with each gate connected to the ground. Furthermore, between the drain of the pair of NMOSs 23, 24 and the pair of complementary output terminals (output nodes A, B), a pair of NMOSs 27, 28 are additionally placed with each gate supplied with a certain potential Vbias. By cascode connection between the pair of PMOSs 25, 26 and the pair of NMOSs 27, 28, the voltage applied between the electrodes of each MOS is limited to prevent the voltage between any pair of electrodes of each MOS from exceeding the breakdown voltage.

In this level shift circuit 130, the maximum voltage applied between the electrodes of each MOS can be set to approximately Vcc by setting Vbias to an appropriate value (e.g., approximately 1.5 V). Thus, stable operation can be achieved even if Vcc has no margin for MOS breakdown voltage.

Sixth Embodiment

Figure 10:
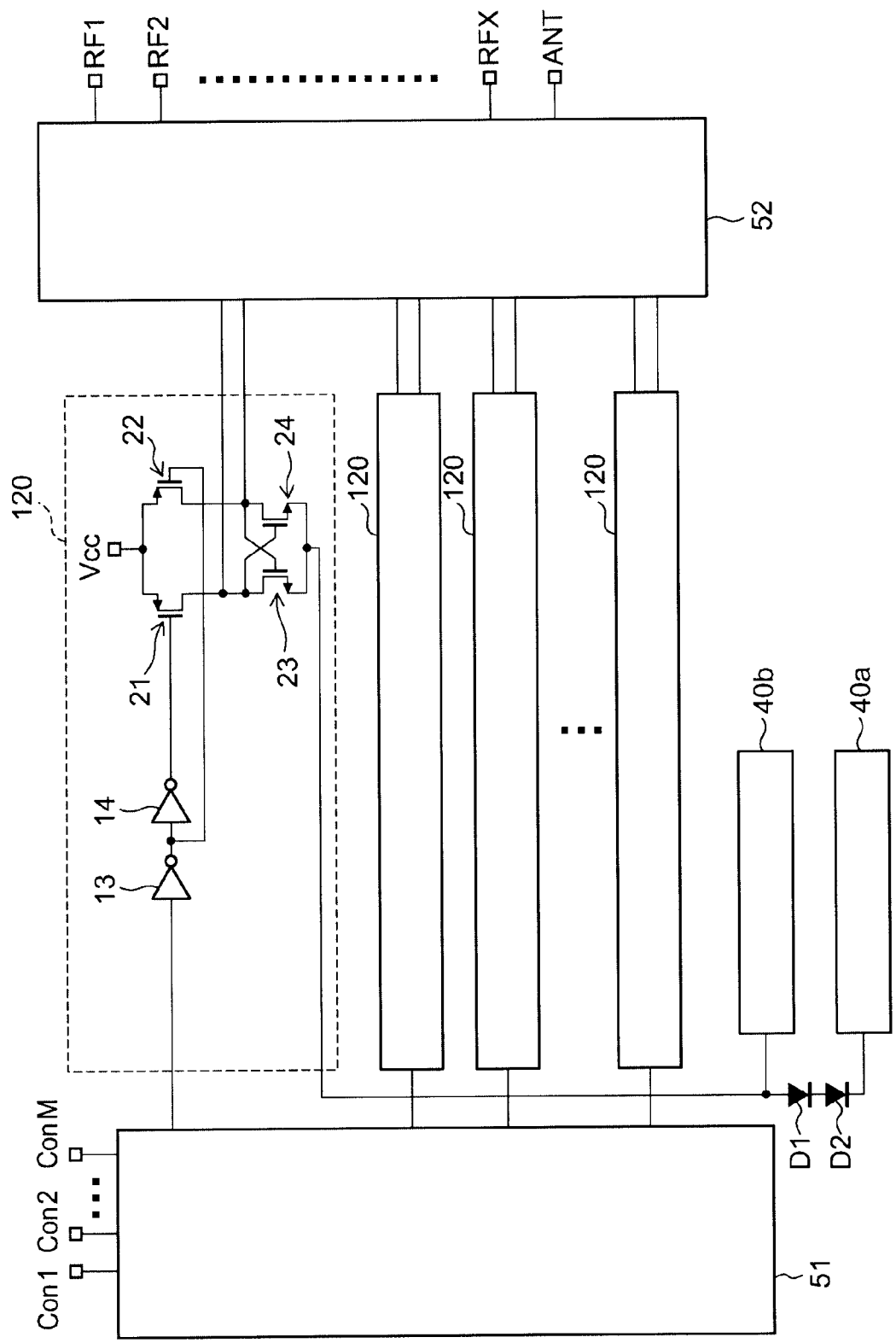
FIG. 10 is a circuit diagram of a high-frequency semiconductor switching device according to a sixth embodiment of the invention.

FIG. 10 is a circuit diagram of a high-frequency semiconductor switching device according to a sixth embodiment of the invention.

The high-frequency multiport switching circuit 52 corresponds to the high-frequency switching circuit 10 in FIG. 6. The high-frequency multiport switching circuit 52 includes one antenna terminal ANT and X high-frequency terminals RF1-RFX. Each high-frequency terminal RF1-RFX corresponds to the transmitting terminal TX or the receiving terminal RX.

A plurality of control circuits 120 are connected to the high-frequency multiport switching circuit 52. Each control circuit 120 corresponds to the control circuit 120 shown in FIG. 6 or 9. The second negative voltage generating circuit 40b, the diodes D1, D2, and the first negative voltage generating circuit 40a described above are connected to the low-potential power supply terminal of the level shift circuit in each control circuit 120.

Each control circuit 120 is connected to a decoder circuit 51. The decoder circuit 51 is an M/N decoder circuit, which decodes control signals at M external control terminals Con1-ConM and supplies the decoded signals to the control circuits 120. The complementary outputs (the outputs of the output nodes A, B) of each control circuit 120 are supplied to the high-frequency multiport switching circuit 52 as its control signals. The low-potential power supply of the decoder circuit 51 is the ground, imposing no burden on the negative voltage generating circuits 40a, 40b.

Seventh Embodiment

Figure 11:
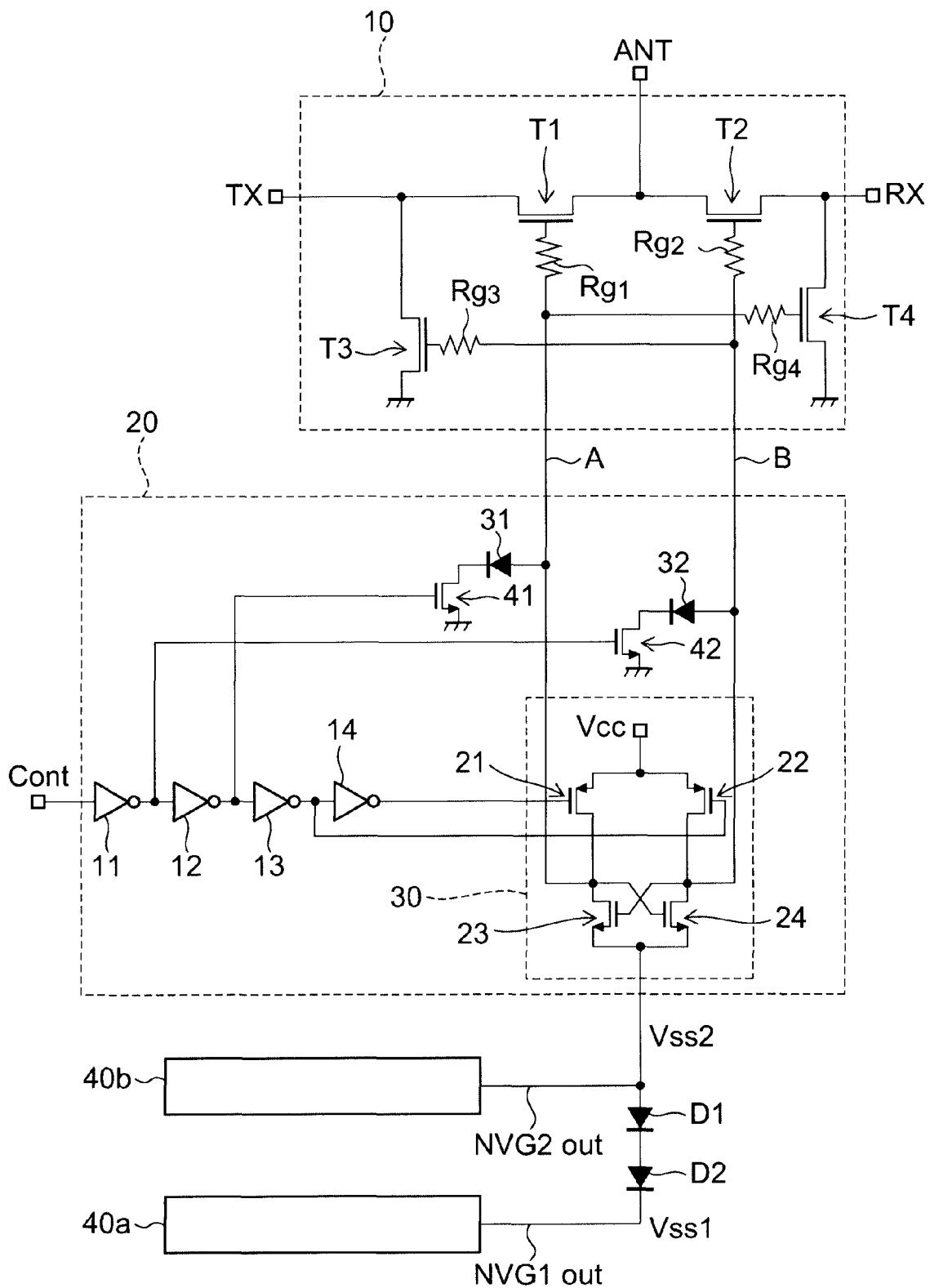
FIG. 11 is a circuit diagram of a high-frequency semiconductor switching device according to a seventh embodiment of the invention.

FIG. 11 is a circuit diagram of a high-frequency semiconductor switching device according to a seventh embodiment of the invention. This embodiment is a combination of the first embodiment and the fourth embodiment described above.

More specifically, the high-frequency semiconductor switching device according to this embodiment comprises, on the same semiconductor substrate (semiconductor chip), a high-frequency switching circuit 10, a control circuit 20, a first negative voltage generating circuit 40a for outputting a negative potential Vss1, a second negative voltage generating circuit 40b for outputting a negative potential Vss2 having a value on the positive side of Vss1, and N stages of diodes D1, D2 (where N is a natural number) connected in series between the output node NVG1out of the first negative voltage generating circuit 40a and the output node NVG2out of the second negative voltage generating circuit 40b with the anodes of the diodes connected on the side of the output node NVG2out of the second negative voltage generating circuit 40b. This embodiment is configured to satisfy Vss2−Vss1<N·Vf, where Vf is the forward voltage of the diode D1, D2.

The control circuit 20 includes a level shift circuit 30, inverters 11-14 provided at its previous stage, a diode 31 with its anode connected to the output node A of the level shift circuit 30, a diode 32 with its anode connected to the output node B of the level shift circuit 30, a transistor 41 connected between the cathode of the diode 31 and the ground, and a transistor 42 connected between the cathode of the diode 32 and the ground.

Also in this embodiment, the falling waveform of the control signal of the high-frequency switching circuit 10 at the turn-off time can be made steep without increasing the output capacitance and current extraction capacity of the negative voltage generating circuits. Hence, the transmission/reception switching time of the time-division transmission/reception switch can be significantly reduced. Furthermore, this embodiment can reduce the output capacitance of the negative voltage generating circuits, which conventionally accounts for a large ratio in chip area. Hence, the chip area can be significantly decreased.

The embodiments of the invention have been described with reference to the examples. However, the invention is not limited thereto, but can be variously modified within the spirit of the invention.

The invention claimed is:

1. A semiconductor switching device comprising, on one semiconductor substrate:
   a switching circuit configured to switch connection states between a plurality of terminals;
   a negative voltage generating circuit; and
   a control circuit connected to the switching circuit and the negative voltage generating circuit and configured to supply a control signal to the switching circuit,
   the control circuit including:
       a level shift circuit supplied with a negative voltage and a high potential voltage and outputting a high level or a low level signal to the switching circuit;
       a diode with its anode connected between the switching circuit and the level shift circuit; and
       a transistor with its drain-source path connected between a cathode of the diode and ground, the drain-source path switching from a blocking state to a conducting state so as to discharge between the switching circuit and the level shift circuit before an output of the level shift circuit switches from the high level to the low level.

2. The semiconductor switching device according to claim 1, wherein the diode is a Schottky barrier diode.

3. The semiconductor switching device according to claim 1, wherein the control circuit further includes:
   a first inverter provided at a previous stage of the level shift circuit and configured to drive the level shift circuit; and
   a second inverter provided at a previous stage of the first inverter and configured to drive the transistor.

4. The semiconductor switching device according to claim 1, wherein the level shift circuit provides the low level to an output node connected to the switching circuit after a potential of the output node of the level shift circuit falls from the high level to the forward voltage of the diode.

5. The semiconductor switching device according to claim 1, wherein the negative voltage generating circuit includes a charge pump circuit.

6. The semiconductor switching device according to claim 5, wherein the negative voltage generating circuit further includes a clamp circuit provided between an output node of the charge pump circuit and the ground and configured to clamp an output potential of the charge pump circuit to a constant level.

7. The semiconductor switching device according to claim 1, wherein the semiconductor switching device is a time-division transmission/reception switch configured to switch a transmitting mode and a receiving mode for a signal in a time-division manner.

* * * * *